United States Patent [19]
Ko et al.

[11] Patent Number: 5,434,108
[45] Date of Patent: Jul. 18, 1995

[54] GROUNDING METHOD TO ELIMINATE THE ANTENNA EFFECT IN VLSI PROCESS

[75] Inventors: Joe Ko, Hsinchu; Chen-Chiu Hsue, Hsin-chu, both of Taiwan

[73] Assignee: United Microelectronics Corporation, Hsinchu,

[21] Appl. No.: 124,647

[22] Filed: Sep. 22, 1993

[51] Int. Cl.6 ......................................... H01L 21/465
[52] U.S. Cl. .................................. 437/228; 437/941
[58] Field of Search ............... 437/228, 245, 949, 195, 437/941; 156/643

[56] References Cited

U.S. PATENT DOCUMENTS 5,041,888  8/1991  Possin et al.
5,120,680  6/1992  Foo et al. ............................ 437/238

OTHER PUBLICATIONS

Shone et al in "Gate Oxide Charging and Its Elimination for Metal Antenna Capacitor and Transistor in VLSI CMOS Double Layer Metal Technology" (published in Symposium on VLSI Technology, pp. 73-74 in Jun., 1988).

Primary Examiner—Olik Chaudhuri
Assistant Examiner—Richard A. Booth
Attorney, Agent, or Firm—George O. Saile; Stephen B. Ackerman

[57] ABSTRACT

A method of subjecting an integrated circuit, having electrically grounded elements and large first metal regions on its surface which are connected to device structures, to a plasma process, is described. Large first metal regions are connected to the electrically grounded elements. The integrated circuit is placed in a chamber for accomplishing the plasma process. The integrated circuit is subjected to the plasma process such that the connecting of the large first metal regions to the electrically grounded elements prevents damage to the device structures. The integrated circuit is removed from the chamber. Finally, the large first metal regions are disconnected from the electrically grounded elements.

11 Claims, 7 Drawing Sheets

GROUNDING METHOD TO ELIMINATE THE ANTENNA EFFECT IN VLSI PROCESS

RELATED PATENT APPLICATIONS

1) "New Layout Design to Eliminate Process Antenna Effect", inventors B. Hsu, J. Ko, U.S. Pat. No. 5,393,701.

2) "Device for Preventing Antenna Effect on Circuit", inventors J. Ko, G. Hong, U.S. Pat. No. 5,350,710.

BACKGROUND OF THE INVENTION (1) Field of the Invention

The invention relates to the manufacture of highly dense integrated circuits and more particularly to the reduction and elimination of electrostatic charge buildup at the device during manufacture in, for example, plasma etching or the like process steps.

(2) Description of the Prior Art

In the manufacture of highly dense integrated circuits using Metal Oxide Semiconductor (MOS) technology with multiple metal layers, electrical charge may build up at the device gate oxide during plasma processing. The charge accumulates on large areas of metal, for example, metal pads, and metal layers electrically connected to the gate oxide. Interconnection metal lines act as "antennas", amplifying the charging effect and leading to trapped charges at the gate oxide. These trapped charges can cause yield loss and reliability failures.

Workers in the field have verified this problem experimentally. Shone et al in "Gate Oxide Charging and Its Elimination for Metal Antenna Capacitor and Transistor in VLSI CMOS Double Layer Metal Technology" (published in "Symposium on VLSI Technology," pp. 73-74 in June, 1988) verified the antenna effect experimentally. They found that the double metal layer technologies worsened the effect by the ratio of the large metal area to the gate oxide area. The worst degradation of gate oxide occurred during oxynitride deposition, however other plasma processing is also believed to lead to trapped charges at the gate oxide. Two suggested methods of preventing the antenna effect proposed by Shone et al were increasing alloy time and attaching a diode to the metal areas. However, the former is not cost effective and does not completely eliminate the charging problem, and the latter method negatively effects device performance.

SUMMARY OF THE INVENTION

It is a principal object of this invention to provide a method for eliminating the antenna effect of accumulated electrical charge on large metal areas and metal interconnections connected to the gate oxide, without additional process steps. This is accomplished by electrically grounding the large metal areas such as contact pads that would normally accumulate most of the damaging charge during plasma processing.

This object is achieved by subjecting an integrated circuit, having electrically grounded elements and large first metal regions on its surface which are connected to device structures, to a plasma process. Large first metal regions are connected to the electrically grounded elements. The integrated circuit is placed in a chamber for accomplishing the plasma process. The integrated circuit is subjected to the plasma process such that the connecting of the large first metal regions to the electrically grounded elements prevents damage to the device structures. The integrated circuit is removed from the chamber. Finally, the large first metal regions are disconnected from the electrically grounded elements.

DESCRIPTION OF THE PREFERRED EMBODIMENTS

Figure 1:
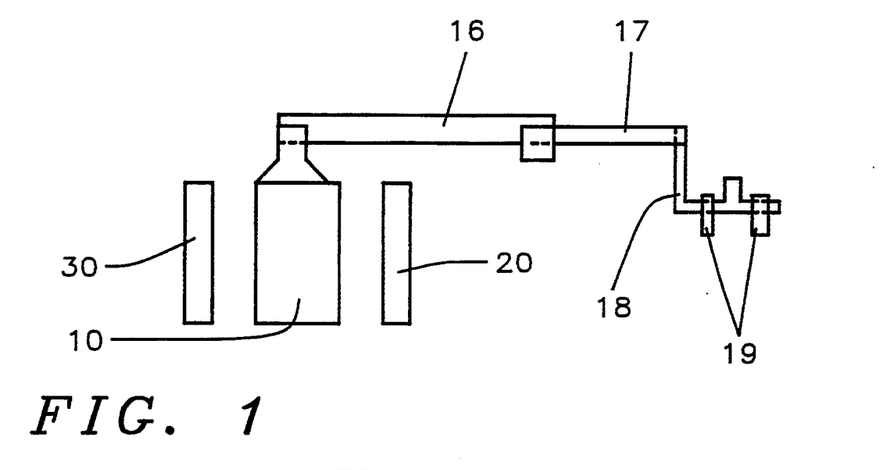
FIG. 1 is a top view of a Prior Art process for forming a large contact pad which is electrically connected to device structures, and voltage connection pads, which could lead to device damage due to the antenna effect.

Referring now to FIG. 1, there is shown a top view to demonstrate the problem found in prior art devices. As can be seen in FIG. 1, in the manufacture of MOS semiconductor devices, a large contact pad area 10 (of typical size 100 by 100 micrometers, and more than about 30 by 30 micrometers) is electrically connected to a polysilicon interconnection 16. The polysilicon interconnection 16 is connected to metal interconnection 17. This metal interconnection 17 is connected to polysilicon 18 and then to active device 19. Alternately, polysilicon interconnection 16 may connect directly to the gate of device 19. There is a direct electrical connection among all elements, and charge accumulated during plasma processing on the conduction layer, and particularly on the large metal areas, can lead to damage to the devices due to discharge which induces gate oxide trapped charges.

It is common in the manufacture of integrated circuits today to use plasmas, with two of the most common processes being reactive plasma etching, and plasma enhanced chemical vapor deposition. A plasma is a collection of charged particles, including electrons and positive and negative ions, and it is these charged particles that collect along the conductive surfaces during plasma processing and may produce the trapped charges damaging the gate oxide.

Figure 2:
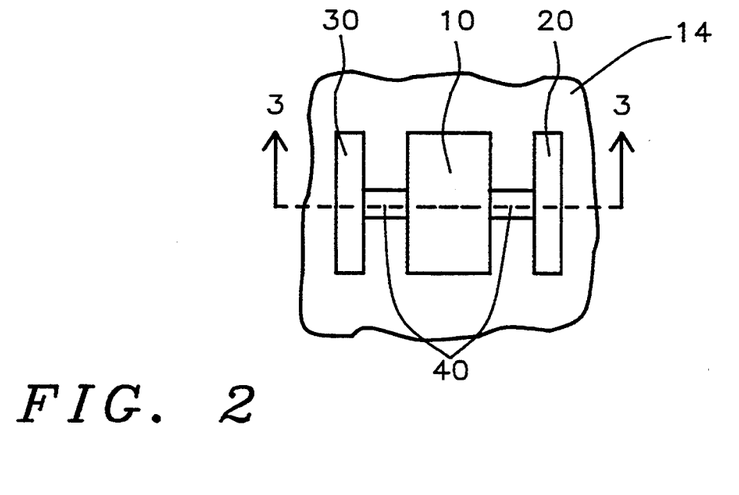
FIGS. 2 through 15 are top views and cross-sectional views that illustrate the method of the present invention for eliminating the antenna effect by connecting large contact pads to electrically grounded voltage pads.

Referring now to FIG. 2, there is shown a top view of the present invention. Large contact pads 10 are typically formed at the periphery of integrated circuits to allow for connections between internal device structures (as shown in FIG. 1) and other integrated circuits. Voltage connection pads 20 and 30 are typically used for $V_{DD}$ and $V_{SS}$, respectively, which are used in the final circuit to provide power supply voltage and ground references, respectively, for the internal circuits. During processing, however, they provide a path to the substrate. Large contact pads 10 and grounded voltage connection pads 20 and 30 are electrically connected during processing by connections 40. The large amount of metal surface areas in the contact pads is the primary location for charge accumulation in the prior art devices, but since the pads in the invention are grounded by connection to the voltage pads, any charge is immediately dissipated to ground. Device damage due to the antenna effect is thus eliminated.

Figure 3:
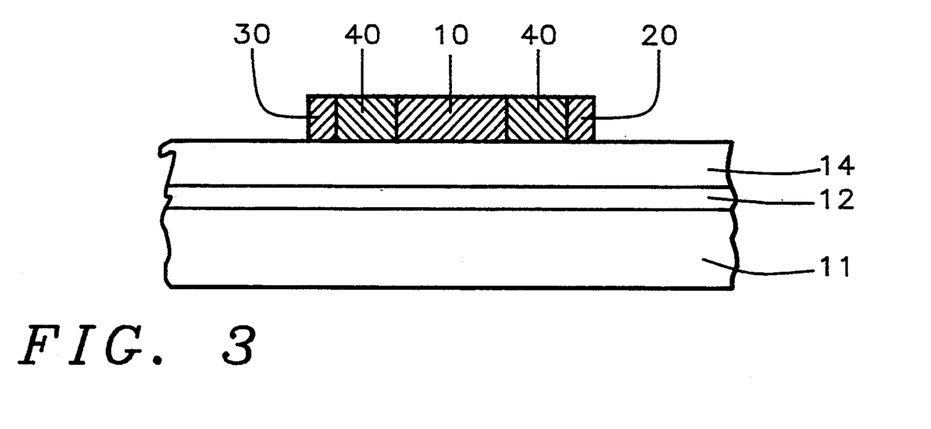

Referring now to FIG. 3, a cross-sectional representation of the the first steps of invention is shown, the cross-section being taken along line 3—3 of FIG. 2. On the substrate 11, typically silicon, is grown field oxide layer 12, to a thickness of between about 2000 and 10,000 Angstroms, by conventional thermal oxidation as is well-known in the art. Layer 14 is a second oxide layer formed by chemical vapor deposition (CVD) to a thickness of between about 3000 and 20,000 Angstroms. A first layer of metal is deposited on layer 14 to a thickness of about 6000 Angstroms, by conventional methods. This layer is then patterned by conventional lithography and etching techniques to form large contact pad 10, voltage connection pads 20 and 30, and electrical connections 40, in the configuration shown by top view in FIG. 2.

Figure 4:
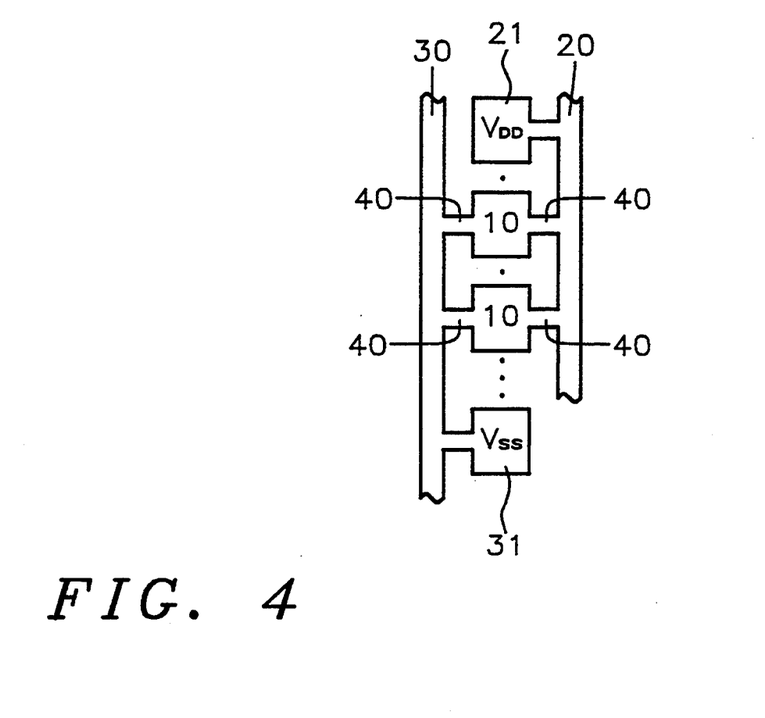
Figure 5:
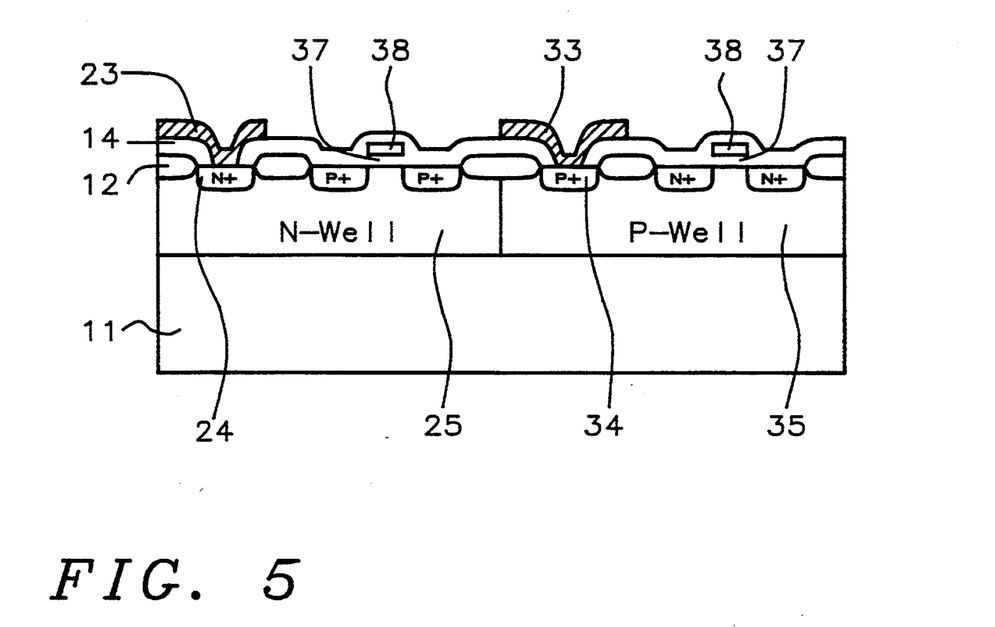

The way in which the contact pads 10 are connected to $V_{DD}$ and $V_{SS}$, and eventually to the grounded substrate, are shown in FIGS. 4 and 5. As seen in the top view of FIG. 4, a plurality of contact pads 10 are connected to $V_{DD}$ strip 20 and $V_{SS}$ strip 30. These strips are connected, respectively, to $V_{DD}$ pad 21 and $V_{SS}$ pad 31. These pads are connected by metal lines (not shown) to the example CMOS device, already formed, shown in FIG. 5.

The CMOS structure shown in FIG. 5 is conventionally formed and well-known in the art, and as it is not important to the invention, its formation will not be particularly described. However, it can be seen that $V_{DD}$ line 23 contacts N+ region 24 and N-well 25, and similarly, $V_{SS}$ line 33 contacts P+ region 34 and P-well 35. It is along these paths that the accumulated charge will travel and be discharged during subsequent plasma processing steps. This prevents charge build-up at gate oxide 37. Polysilicon gate 38 is connected to contact pads 10. Since the metal in the $V_{DD}$ and $V_{SS}$ lines has a higher conductivity than that of the polysilicon connected to gate 38, the charge will be discharged through $V_{DD}$ and $V_{SS}$ rather than accumulating at the gate oxide.

After deposition of the first metal layer, the processing steps occur which would normally cause charge build-up. However, in the invention all metal pads and large metal areas are connected to the substrate and wells, and thus any charge accumulated on large metal areas is discharged to ground.

Figure 6:
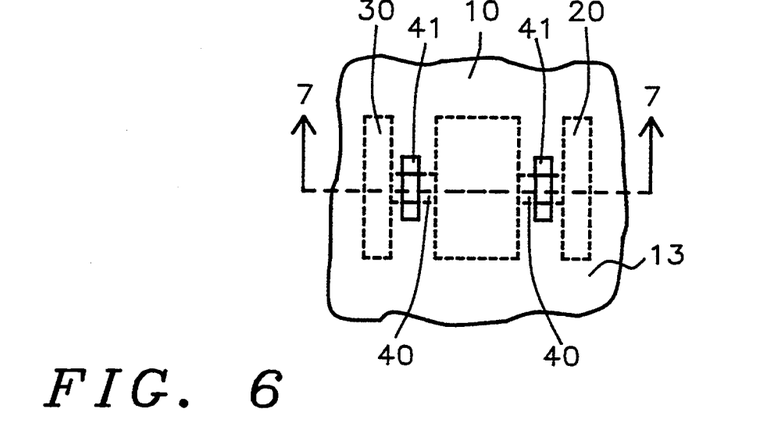
Figure 7:
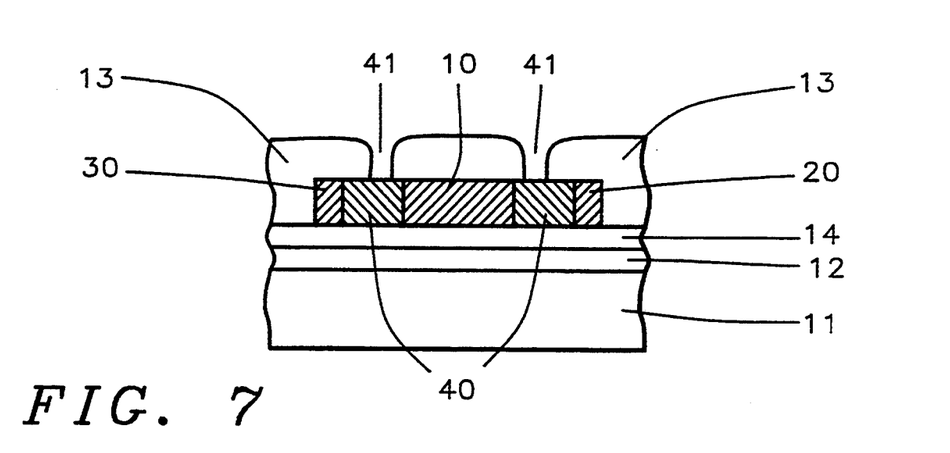

A first method for forming subsequent metal layers and breaking the connection are shown in FIGS. 6 to 11. Referring now to FIGS. 6 and 7, which are a top view and cross-sectional view along line 7—7, respectively, an intermetal dielectric layer 13 is deposited on pads 10, 20 and 30, connections 40, by conventional methods as are well known in the art. Vias 41 are formed by conventional lithography and etching techniques in layer 13 to form openings to connections 40.

Figure 8:
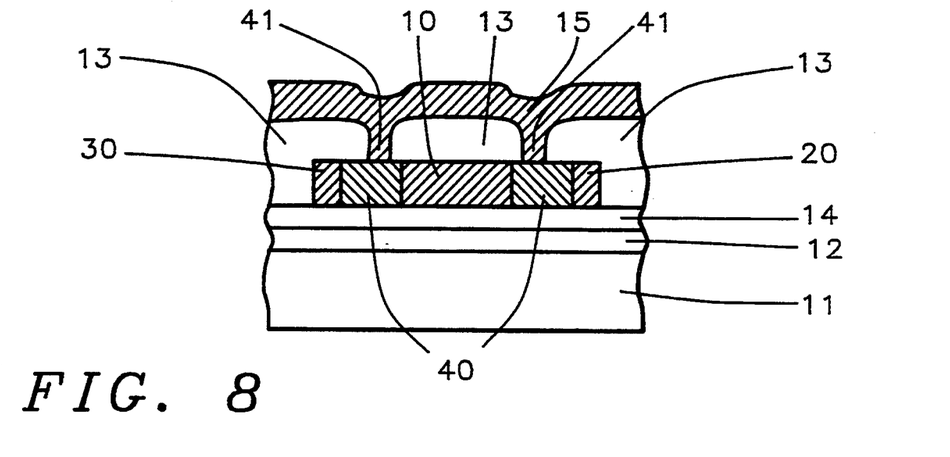

Referring now to FIG. 8, a second metal layer 15 is deposited over dielectric layer 13 and contacts to connections 40 through vias 41. Two, or more, levels of metallization are frequently needed in modern integrated circuits, to save chip area and minimize resistance. A conventional metal etching of portions of both metal layers is now accomplished.

Figure 9:
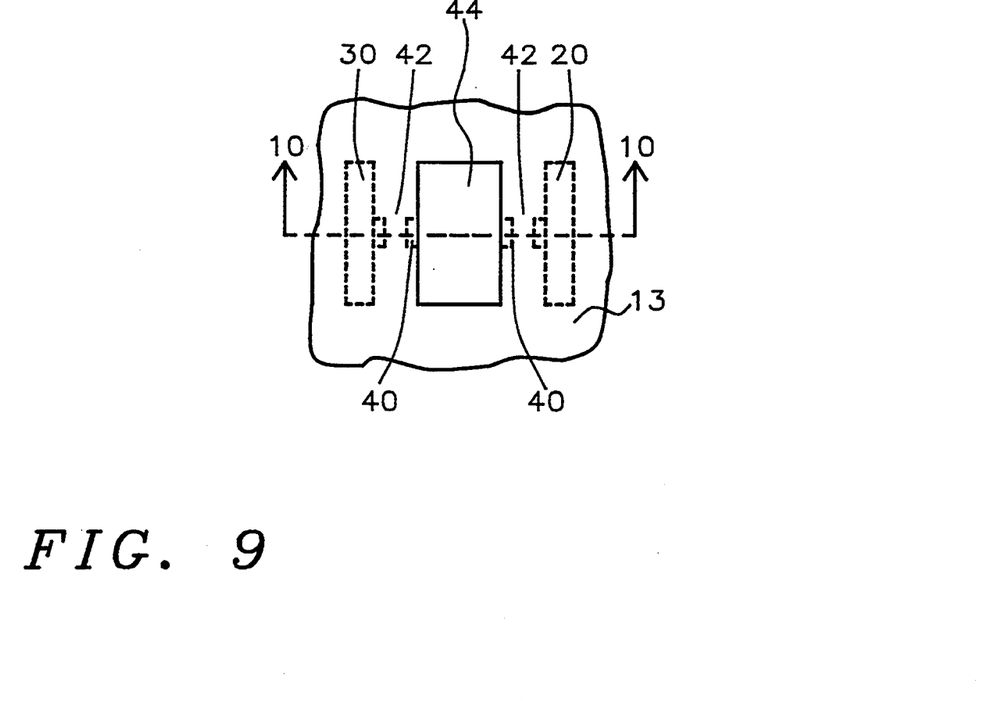
Figure 10:
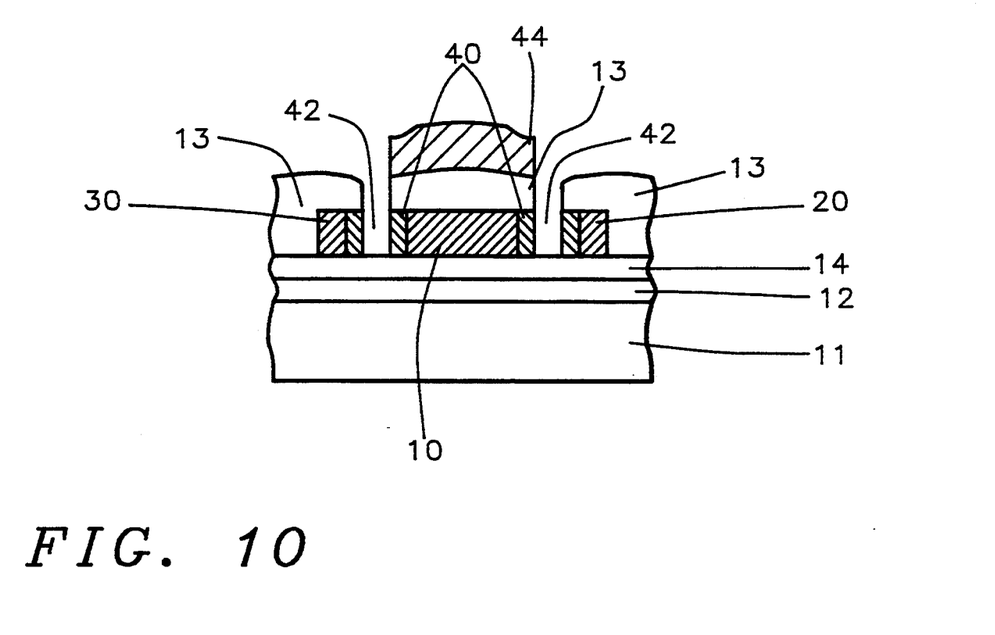
Figure 11:
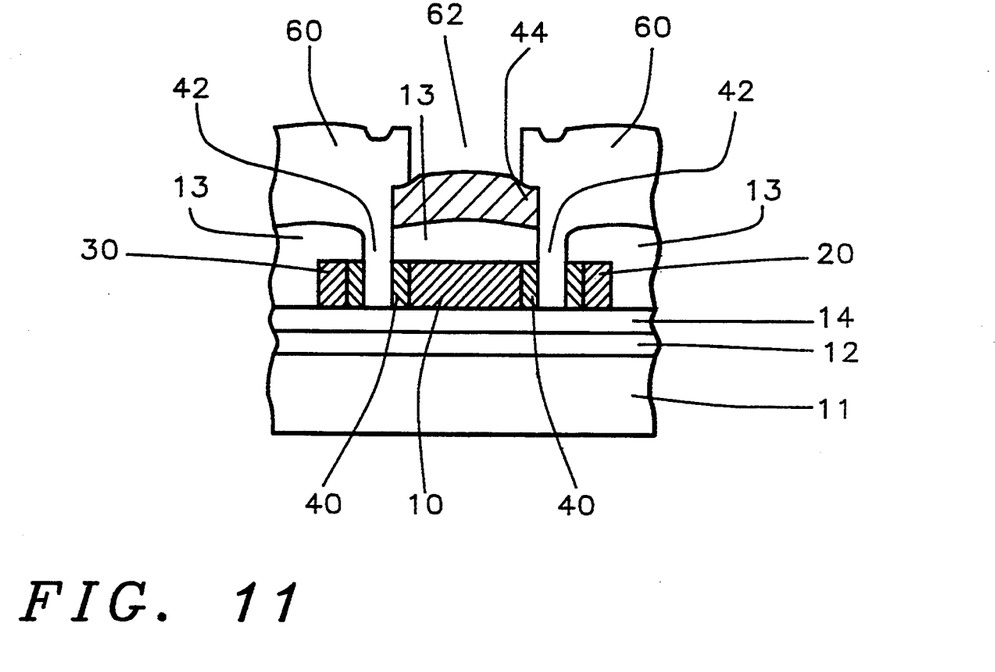

Referring now to FIGS. 9 and 10, a photoresist mask (not shown) is patterned by conventional lithography to mask contact pad 44, as shown in FIG. 10, of the second metal layer. The remainder of the second metal layer from FIG. 8, as well as that portion of the first metal layer at electrical connections 40 exposed by vias 41, are etched by conventional metal etching means, simultaneously. This is accomplished by a 100% overetch of the second metal layer. This breaks the electrical connections 40, since they are no longer needed for charge dissipation, thus disconnecting large contact pad 10 from voltage pads 20 and 30, after all processing that could lead to antenna effect device damage has been completed. Contact pad 44 from the second metal layer remains as is shown in-the accompanying figures. Finally, referring to FIG. 11, a passivation layer 60 is deposited and patterned to provide a contact opening 62 to contact pad 44.

Figure 12:
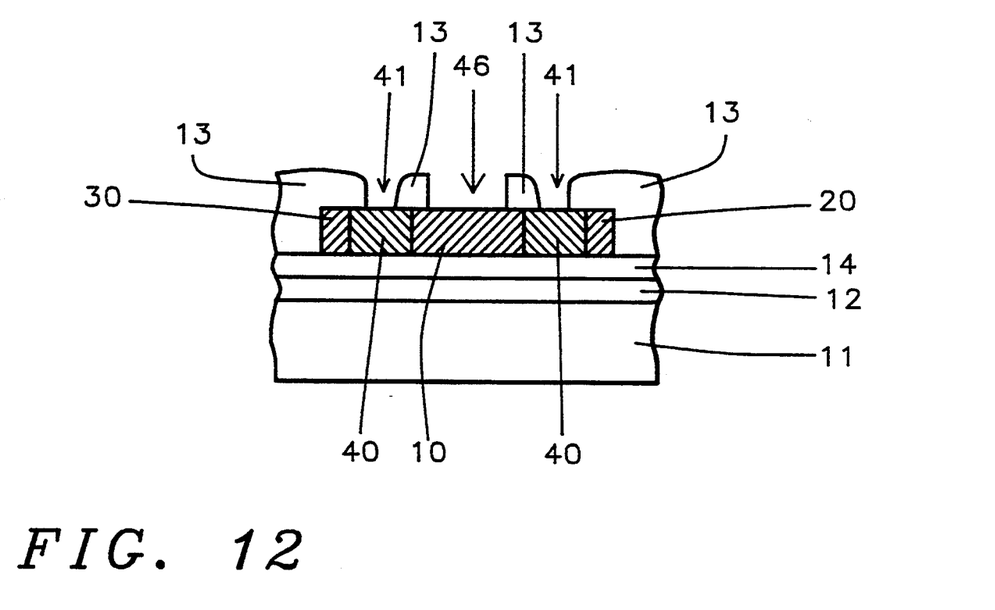
Figure 13:
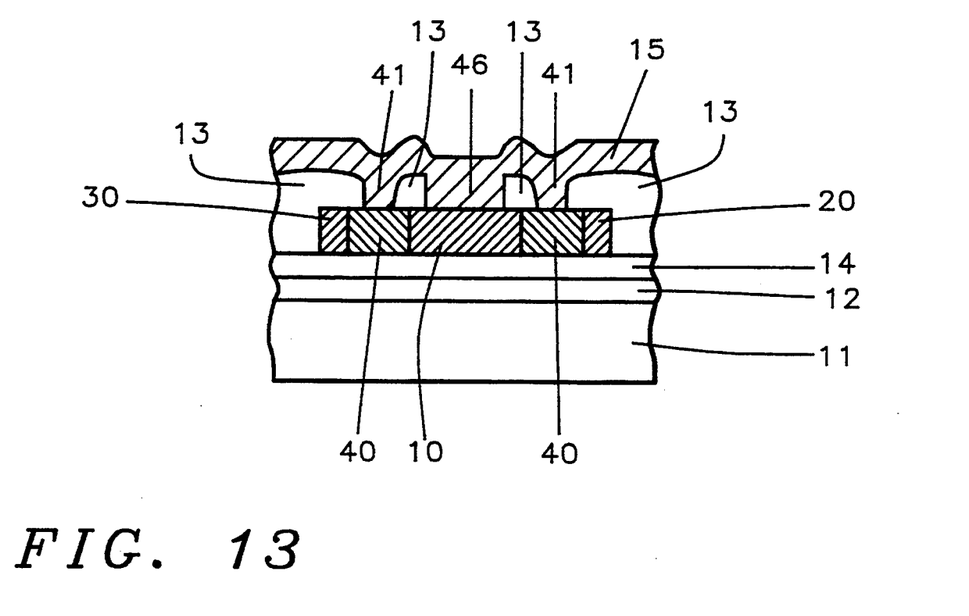

A second method for forming subsequent metal layers and breaking the connection are shown in FIGS. 12 to 15. Starting with the FIG. 3 structure, intermetal dielectric layer 13 is deposited on pads 10, 20 and 30, and connections 40 as in the first method. Vias 41, are formed by conventional lithography and etching techniques in layer 13 to form openings to connections 40, as well as an opening 46 to pad 10, which results in the structure as shown in FIG. 12. Referring now to FIG. 13, a second metal layer 15 is deposited over dielectric layer 13 and contacts to connections 40 through vias 41, and to pad 10 through via 46.

Figure 14:
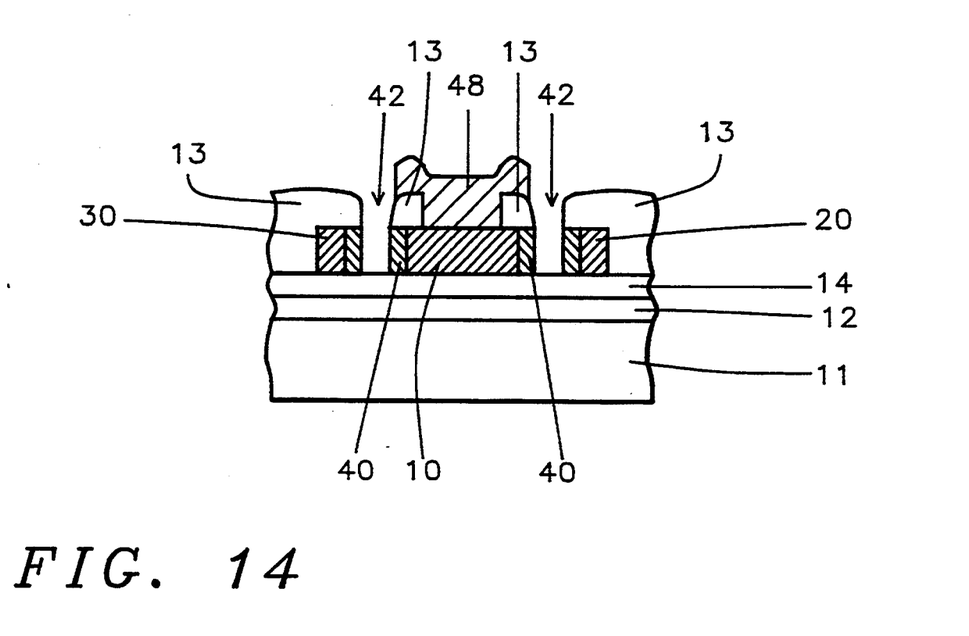
Figure 15:
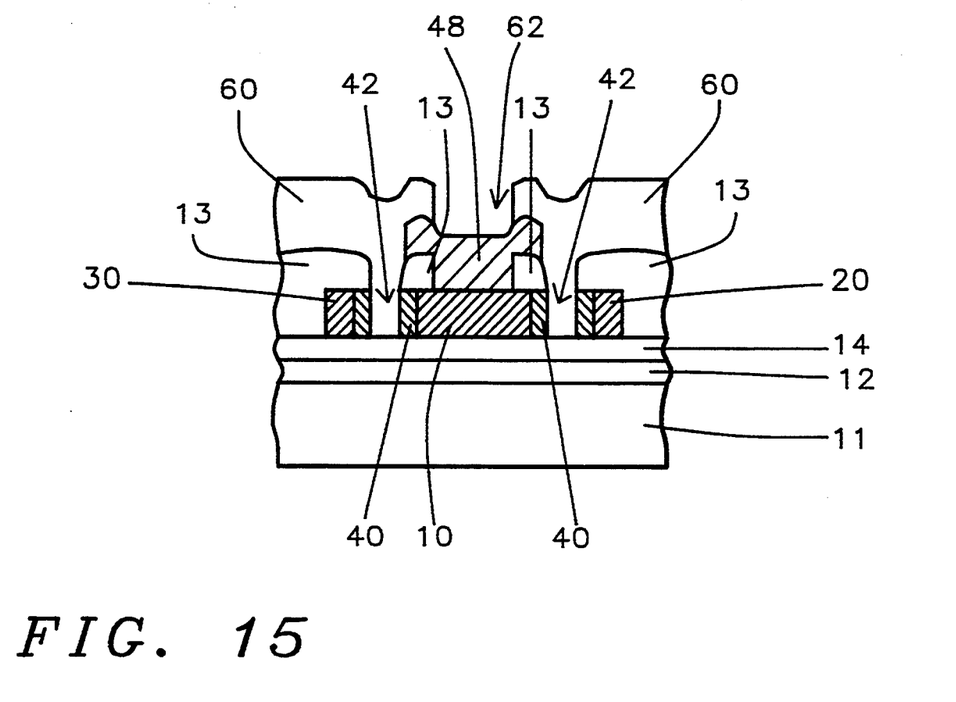

Referring now to FIG. 14, an etching of portions of both metal layers is accomplished. A photoresist mask (not shown) is patterned by conventional lithography to mask contact pad 48 of the second metal layer. The remainder of the second metal layer as shown in FIG. 13, as well as that portion of the first metal layer at electrical connections 40 exposed by vias 41, are etched by conventional metal etching means, simultaneously. This breaks the electrical connections 40, since they are no longer needed for charge dissipation. The final structure is shown in FIG. 15, on which a passivation layer 60 has been deposited and patterned to provide a contact opening 62 to contact pad 48.

It can be understood by those skilled in the art that the method of the invention can be applied to greater than two levels of metallization, by forming alternating layers of interlevel dielectric and metal, above the FIG. 8 structure, for example, and etching through to break connections 40 as a final step.

While the invention has been particularly shown and described with reference to the preferred embodiments thereof, it will be understood by those skilled in the art that various changes in form and details may be made without departing from the spirit and scope of the invention.

What is claimed is:

1. A method of subjecting an integrated circuit, having electrically grounded elements and first metal regions on its surface which are connected to device structures, to a plasma process, comprising the steps of:
   connecting said first metal regions to said electrically grounded elements;
   placing said integrated circuit in a chamber for accomplishing said plasma process;
   subjecting said integrated circuit to said plasma process such that said connecting of said first metal regions to said electrically grounded elements prevents damage to said device structures;
   removing said integrated circuit from said chamber; and disconnecting said first metal regions from said electrically grounded elements.

2. The method of claim 1 wherein said processing in a plasma environment is plasma enhanced chemical vapor deposition.

3. The method of claim 1 wherein said processing in a plasma environment is plasma etching.

4. The method of claim 3 wherein said processing in a plasma environment is a sputter etch.

5. The method of claim 1 wherein said first metal regions are contact pads.

6. The method of claim 1 wherein said electrically grounded elements are connected to a grounded substrate through said device structures.

7. A method of subjecting an integrated circuit with CMOS device structures to a plasma process, comprising the steps of:
  forming a first layer of metal on said integrated circuit;
  patterning said first layer of metal to form contact pads, voltage connection pads, and electrical connections between said contact pads and said voltage connection pads;
  connecting said voltage connection pads to ground through said device structures;
  processing said integrated circuit in a plasma environment that would normally produce electrical charge build-up at gate oxide of said device structures, but said connection to ground prevents said charge build-up; and
  disconnecting said contact pads from said voltage connection pads.

8. The method of claim 7 wherein said processing in a plasma environment is plasma enhanced chemical vapor deposition.

9. The method of claim 7 wherein said processing in a plasma environment is plasma etching.

10. The method of claim 9 wherein said processing in a plasma environment is a sputter etch.

11. The method of claim 7, after the step of said processing in a plasma environment further comprising the steps of:
  forming a dielectric layer over said first layer of metal;
  forming openings to said electrical connections through said dielectric layer;
  forming a second layer of metal over said dielectric layer and contacting said electrical connection through said openings;
  removing said second layer of metal except over said contact pad;
  removing said first layer of metal under said opening to break said electrical connection; and
  forming a passivation layer over the entire integrated circuit, with an opening to an exposed portion of said second metal layer.

* * * * *